(12) United States Patent
Huang et al.

(10) Patent No.: US 9,177,905 B2
(45) Date of Patent: Nov. 3, 2015

(54) CHIP PACKAGE HAVING SENSING ELEMENT AND METHOD FOR FORMING THE SAME

(71) Applicant: XINTEC INC., Jhongli, Taoyuan County (TW)

(72) Inventors: Yu-Ting Huang, Zhongli (TW); Tsang-Yu Liu, Zhubei (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 14/036,954

(22) Filed: Sep. 25, 2013

(65) Prior Publication Data

US 2014/0084458 A1    Mar. 27, 2014

Related U.S. Application Data

(60) Provisional application No. 61/705,322, filed on Sep. 25, 2012.

(51) Int. Cl.

| | | |
|---|---|---|
| *H01L 23/498* | (2006.01) | |
| *H01L 21/768* | (2006.01) | |
| *H01L 23/48* | (2006.01) | |
| *B81B 7/00* | (2006.01) | |
| *H01L 23/31* | (2006.01) | |

(52) U.S. Cl.
CPC ........ *H01L 23/49827* (2013.01); *B81B 7/0061* (2013.01); *H01L 21/76885* (2013.01); *H01L 23/481* (2013.01); *H01L 23/3107* (2013.01); *H01L 2224/13* (2013.01); *H01L 2924/13091* (2013.01); *H01L 2924/1461* (2013.01)

(58) Field of Classification Search
CPC .............. H01L 21/67; H01L 21/67173; H01L 21/67236; H01L 2225/1064; H01L 2225/107; H01L 23/49805; H01L 2225/1005; H01L 2225/1058; H01L 2924/16152; H01L 33/504; H01L 23/49827; H01L 21/76885; H01L 23/481; H01L 3924/13; H01L 23/3107; H01L 2924/1461; H01L 2924/00
USPC ................. 257/737, 738, 778, 734, E23.068, 257/E21.499, 98, E33.056, 620, 618, 774, 257/773, 786, 698, E23.011, 416, 434, 680, 257/414, 253, E23.002
See application file for complete search history.

(56) References Cited

U.S. PATENT DOCUMENTS

| | | | | |
|---|---|---|---|---|
| 5,869,749 | A * | 2/1999 | Bonne et al. | 73/53.01 |
| 8,316,533 | B2 * | 11/2012 | Suminto et al. | 29/830 |
| 8,399,963 | B2 * | 3/2013 | Tsai et al. | 257/620 |
| 8,399,964 | B2 * | 3/2013 | Katti | 257/659 |
| 8,575,634 | B2 * | 11/2013 | Liu et al. | 257/98 |
| 2005/0077458 | A1 * | 4/2005 | Ma et al. | 250/239 |
| 2006/0051887 | A1 * | 3/2006 | Yamamoto et al. | 438/64 |
| 2006/0227845 | A1 * | 10/2006 | Degertekin et al. | 372/102 |
| 2009/0050995 | A1 * | 2/2009 | Liu et al. | 257/434 |

(Continued)

*Primary Examiner* — Alexander Oscar Williams
(74) *Attorney, Agent, or Firm* — Liu & Liu

(57) ABSTRACT

A chip package for a sensing element. The chip package includes a substrate having a first surface and a second surface, and a sensing layer having a sensing region disposed on the first surface of the substrate. A conducting pad structure is disposed on the substrate and electrically connected to the sensing region, and a spacer layer is disposed on the first surface of the substrate. A semiconductor substrate is place on the spacer layer. The semiconductor substrate, the spacer layer, and the substrate together surround a cavity on the sensing region. A through-hole extends from a surface of the semiconductor substrate toward the substrate, and connects to the cavity.

20 Claims, 8 Drawing Sheets

(56) References Cited

U.S. PATENT DOCUMENTS

| | | | |
|---|---|---|---|
| 2009/0050996 A1* | 2/2009 | Liu et al. | 257/434 |
| 2009/0202997 A1* | 8/2009 | Sinner et al. | 435/6 |
| 2009/0244336 A1* | 10/2009 | Busse | 348/294 |
| 2010/0055821 A1* | 3/2010 | Buhler et al. | 438/51 |
| 2010/0139389 A1* | 6/2010 | Morita et al. | 73/204.11 |
| 2010/0148293 A1* | 6/2010 | Jain et al. | 257/434 |
| 2010/0224004 A1* | 9/2010 | Suminto et al. | 73/727 |
| 2011/0002359 A1* | 1/2011 | Benzel et al. | 374/178 |
| 2011/0156074 A1* | 6/2011 | Liu et al. | 257/98 |
| 2012/0196470 A1* | 8/2012 | Sugimoto | 439/345 |
| 2012/0264249 A1* | 10/2012 | Kundalgurki et al. | 438/50 |
| 2012/0328132 A1* | 12/2012 | Wang | 381/174 |
| 2013/0020700 A1* | 1/2013 | Liu et al. | 257/737 |
| 2013/0328147 A1* | 12/2013 | Ho et al. | 257/432 |
| 2013/0334627 A1* | 12/2013 | Conti et al. | 257/416 |
| 2014/0154840 A1* | 6/2014 | Chang et al. | 438/109 |
| 2014/0190273 A1* | 7/2014 | Kono et al. | 73/861.47 |
| 2014/0199835 A1* | 7/2014 | Yen et al. | 438/668 |
| 2014/0203387 A1* | 7/2014 | Suen et al. | 257/431 |
| 2014/0203416 A1* | 7/2014 | Huang | 257/659 |
| 2014/0264771 A1* | 9/2014 | Lee et al. | 257/620 |

* cited by examiner

CHIP PACKAGE HAVING SENSING ELEMENT AND METHOD FOR FORMING THE SAME

CROSS REFERENCE TO RELATED APPLICATIONS

This Application claims the benefit of U.S. Provisional Application No. 61/705,322, filed on Sep. 25, 2012, the entirety of which is incorporated by reference herein.

BACKGROUND OF THE INVENTION

1. Field of the Invention

The invention relates to a chip package and method for forming the same, and more particularly to a chip package formed by wafer scale package processes.

2. Description of the Related Art

The chip packaging process is an important step in the process of fabricating an electronic product. Chip packages not only protect the chips therein from outer environmental contaminants, but they also provide electrical connection paths between electronic elements inside and outside of the chip package.

How to reduce the size of the chip packages, fabricate numerous chip packages, and reduce the cost and time required for processing have become important issues.

BRIEF SUMMARY OF THE INVENTION

An embodiment of a chip package comprises a substrate having a first surface and a second surface. A sensing layer is disposed on the first surface of the substrate, wherein the sensing layer has a sensing region. A conducting pad structure is disposed on the substrate and electrically connected to the sensing region. A spacer layer is disposed on the first surface of the substrate. A semiconductor substrate is placed on the spacer layer, wherein the semiconductor substrate, the spacer layer, and the substrate together surround a cavity on the sensing region. A through-hole extends from a surface of the semiconductor substrate toward the substrate, wherein the through-hole connects to the cavity.

A method for forming a chip package comprises providing a substrate having a first surface and a second surface, wherein a sensing layer having a sensing region is disposed on the first surface of the substrate, and a conducting pad structure is disposed on the substrate and electrically connected to the sensing region. A spacer layer is formed on the first surface of the substrate. A semiconductor substrate is provided. The semiconductor substrate is placed on the substrate, and the spacer layer is placed between the substrate and the semiconductor substrate, wherein the semiconductor substrate, the spacer layer, and the substrate together surround a cavity on the sensing region. The semiconductor substrate is partially removed to form a through-hole extending toward the substrate, wherein the through-hole connects to the cavity.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The making and using of the embodiments of the present disclosure are discussed in detail below. However, it should be noted that the embodiments provide many applicable inventive concepts that can be embodied in a variety of specific methods. The specific embodiments discussed are merely illustrative of specific methods to make and use the embodiments, and do not limit the scope of the disclosure. The disclosed contents of the present disclosure include all the embodiments derived from claims of the present disclosure by those skilled in the art. In addition, the present disclosure may repeat reference numbers and/or letters in the various embodiments. This repetition is for the purpose of simplicity and clarity, and does not imply any relationship between the different embodiments and/or configurations discussed. Furthermore, when a first layer is referred to as being on or overlying a second layer, the first layer may be in direct contact with the second layer, or spaced apart from the second layer by one or more material layers.

A chip package according to an embodiment of the present invention may be used to package a variety of chips. For example, the chip package of the embodiments of the invention may be implemented to package active or passive devices or electronic components of integrated circuits, such as digital or analog circuits. For example, the chip package is related to optoelectronic devices, micro-electro-mechanical systems (MEMS), microfluidic systems, and physical sensors measuring changes to physical quantities such as heat, light, pressure, and so on. Particularly, a wafer scale package (WSP) process may be optionally used to package semiconductor chips, such as image sensor elements, light-emitting diodes (LEDs), solar cells, RF circuits, accelerators, gyroscopes, microactuators, surface acoustic wave devices, pressure sensors, ink printer heads, power metal oxide semiconductor field effect transistor modules (power MOSFET modules), and so on.

The above-mentioned wafer scale package process mainly means that after the package step is accomplished during the wafer stage, the wafer with chips is cut to obtain individual packages. However, in a specific embodiment, separated semiconductor chips may be redistributed on a carrier wafer and then packaged, which may also be referred to as a wafer scale package process. In addition, the above-mentioned wafer scale package process may also be adapted to form a chip package having multi-layer integrated circuit devices by stacking a plurality of wafers having integrated circuits. In one embodiment, the described chip package is diced and then forms a chip scale package (CSP). The size of the chip scale package (CSP) may be only slightly larger than that of the packaged chip. For example, the size of the chip scale package is not larger than 120% of the size of the packaged chip.

Figure 1A:
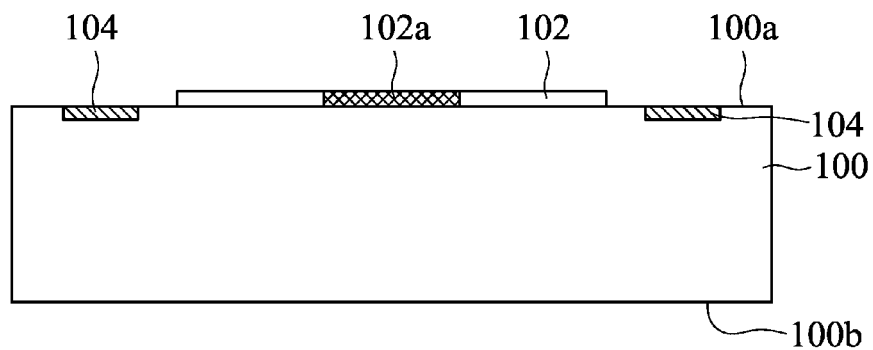
FIGS. 1A-1G are cross-sectional views of an exemplary embodiment of a method for forming a chip package according to the invention.

FIGS. 1A-1G are cross-sectional views of an exemplary embodiment of a method for forming a chip package according to the invention. As shown in FIG. 1A, a substrate 100 having a surface 100a and a surface 100b is provided. The substrate 100 may be a semiconductor substrate. In one embodiment, the substrate 100 is a semiconductor wafer, such as a silicon wafer.

In one embodiment, a sensing layer 102 having a sensing region 102a may be formed on the surface 100a of the substrate 100. For example, the sensing region 102a comprises, but is not limited to, temperature-sensing elements, humidity-sensing elements, pressure-sensing elements, or combinations thereof. For example, elements in the sensing region 102a may be electrically connected to conducting pad structures 104 disposed on the substrate 100 by an interconnection (not shown). In one embodiment, the conducting pad structures 104 may be formed in a dielectric layer (not shown) on the substrate 100. The conducting pad structures 104 may be formed of a plurality of stacked conducting pads, a single conducting pad, or a plurality of conducting pads and interconnection structures therebetween.

Figure 1B:
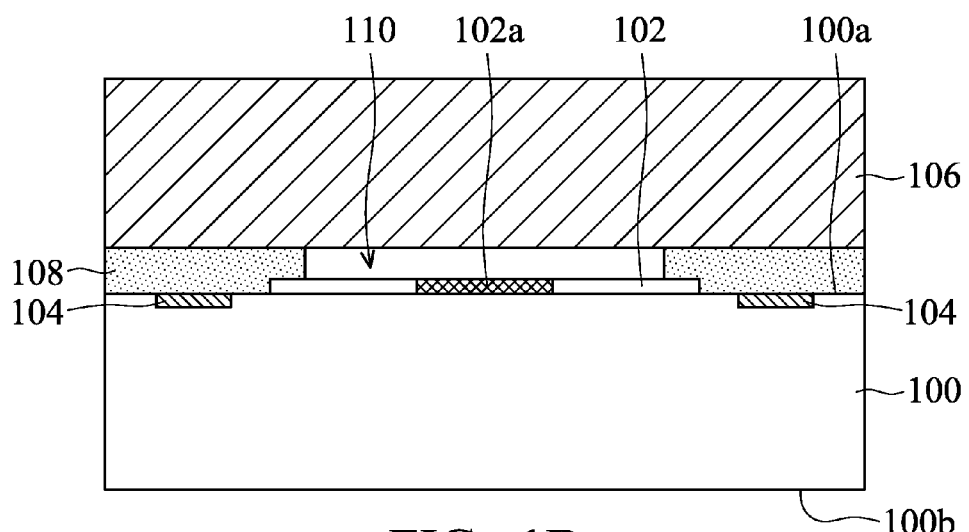

Next, as shown in FIG. 1B, a semiconductor substrate 106 is placed on the substrate 100, and a spacer layer 108 is disposed therebetween. In one embodiment, the spacer layer 108 may be formed on a lower surface of the semiconductor substrate 106. In one embodiment, the spacer layer 108 comprises epoxy, silicone-based polymers, inorganic materials, or combinations thereof In one embodiment, the spacer layer 108 comprises photoresist materials and may be patterned by expose and develop processes. In one embodiment, the spacer layer 108 has a substantially flat surface. In one embodiment, the spacer layer 108 does not substantially absorb moisture.

Then, the semiconductor substrate 106 and the spacer layer 108 may be placed on the surface 100a of the substrate 100. The semiconductor substrate 106, the spacer layer 108, and the substrate 100 may together surround a cavity 110 on the sensing region 102a. For example, the semiconductor substrate 106 may be, but is not limited to, a silicon substrate. In one embodiment, the spacer layer 108 may be in direct contact with the semiconductor substrate 106. In addition, in one embodiment, the spacer layer 108 has adhesive properties and may be attached to the substrate 100 and the semiconductor substrate 106. Therefore, the spacer layer 108 may not be in contact with any adhesive glue.

In addition, in another embodiment, the spacer layer 108 may have been previously formed on the surface 100a of the substrate 100. The semiconductor substrate 106 is then attached on the spacer layer 108.

In order to form wires electrically connecting to the conducting pad structures 104, a through-substrate conductive structure may be optionally formed in the substrate 100. However, it should be noted that the invention is not limited thereto. In other embodiments, other conductive lines, such as wires, may be chosen to form electrical connections to the conducting pad structures 104.

Figure 1C:
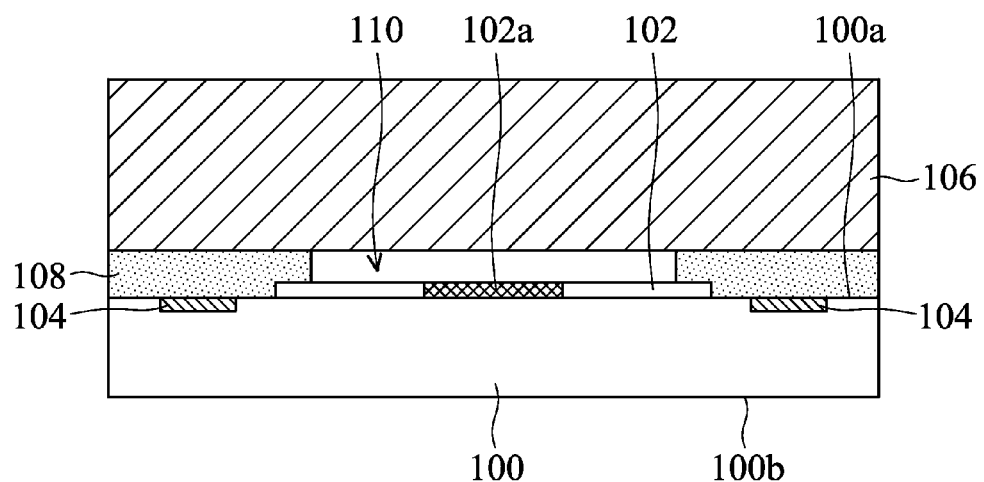

As shown in FIG. 1C, the substrate 100 may be optionally thinned from the surface 100b of the substrate 100. For example, a mechanical polishing process, a chemical mechanical polishing process, an etching process, or combinations thereof may be performed on the surface 100b of the substrate 100 so as to thin the substrate 100 to a suitable thickness.

Figure 1D:
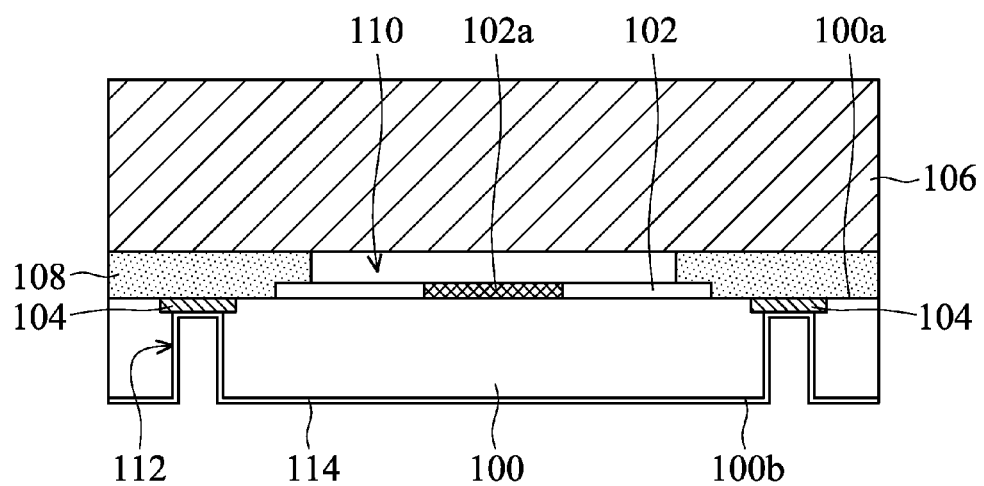

As shown in FIG. 1D, the substrate 100 is partially removed from the surface 100b of the substrate 100 to form holes 112 extending toward the conducting pad structures 104. In one embodiment, the holes 112 may be formed by a dry etching process, a wet etching process, a laser engraved process, or combinations thereof. In one embodiment, the conducting pad structures 104 may be partially exposed by the holes 112. The sidewalls of the holes 112 may be perpendicular to the surface 100b of the substrate 100. Or perhaps the sidewalls of the holes 112 may be inclined to the surface 100b of the substrate 100. In one embodiment, the caliber of the holes 112 may be gradually increased along a direction from the surface 100b toward the surface 100a. Or perhaps the caliber of the holes 112 may be gradually decreased along a direction from the surface 100b toward the surface 100a. During the various processes performed on the substrate 100, the semiconductor substrate 106 may be a support substrate to facilitate the operation of the various processes. Therefore, the semiconductor substrate 106 preferably has a substantially flat upper surface to more accurately perform the subsequent processes.

Next, as shown in FIG. 1D, an insulating layer 114 may be formed on the surface 100b of the substrate 100 and the sidewalls and the bottom of the holes 112. The materials of the insulating layer 114 may be, but are not limited to, epoxy, solder mask material, or other suitable insulating materials such as inorganic materials including silicon oxide, silicon nitride, silicon oxynitride, metal oxide, or combinations thereof, or organic polymer materials including polyimide, butylcyclobutene (BCB, Dow Chemical Co.), parylene, polynaphthalenes, fluorocarbons, acrylates, and so on. The insulating layer 114 may be formed by a coating process, such as a spin coating process, a spray coating process, or a curtain coating process, or other suitable deposition methods, such as a liquid phase deposition process, a physical vapor deposition process, a chemical vapor deposition process, a low-pressure chemical vapor deposition process, a plasma-enhanced chemical vapor deposition process, a rapid thermal chemical vapor deposition process, or an atmospheric pressure vapor deposition process.

Figure 1E:
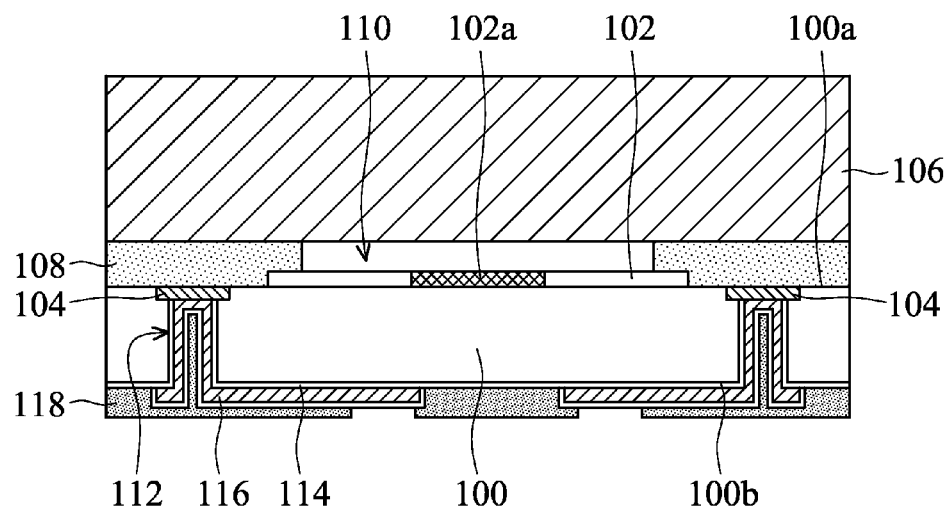

As shown in FIG. 1E, the insulating layer 114 may be partially removed, such as by an etching process, to expose the conducting pad structures 104. Then, a wire layer 116 may be formed on the insulating layer 114. The wire layer 116 may extend into the holes 112 to electrically connect to the conducting pad structures 104. For example, materials of the wire layer 116 may be, but are not limited to, copper, aluminum, gold, platinum, nickel, tin, or combinations thereof Alternatively, the wire layer 116 may comprise conductive polymer materials or conductive ceramic materials, such as indium tin oxide or indium zinc oxide. The formation method of the wire layer 116 may be a physical vapor deposition process, a chemical vapor deposition process, an electroplating process, an electroless plating process, or combinations thereof In one embodiment, a seed layer (not show) may be formed on the surface 100b of the substrate 100 by a physical vapor deposition process. Next, a patterned mask layer (not shown) may be formed on the seed layer. The patterned mask layer has open patterns corresponding to the patterns of the wire layer to be formed, and exposing the underlying seed layer. Next, a conductive material is electroplated on the exposed seed layer and the patterned mask layer is then removed. Subsequently, the seed layer originally covered by the patterned mask layer is partially removed by an etching process to form the wire layer 116 having the desired patterns. In one embodiment, other conductive layers may be formed on the surface of the wire layer 116 to protect the wire layer 116 or facilitate the subsequent bump processes.

Next, a protective layer 118 may optionally be formed on the surface 100b of the substrate 100. Materials of the protective layer 118 may be, but are not limited to, solder mask, polyimide, polyimide-like material, or combinations thereof The formation method of the protective layer 118 may be an electroplating process, a spin coating process, a spray coating process, a curtain coating process, or combinations thereof In one embodiment, the protective layer 118 comprises photoresist material and may be patterned by expose and develop processes. For example, the protective layer 118 may have openings exposing portions of the wire layer 116, as shown in FIG. 1E.

Figure 1F:
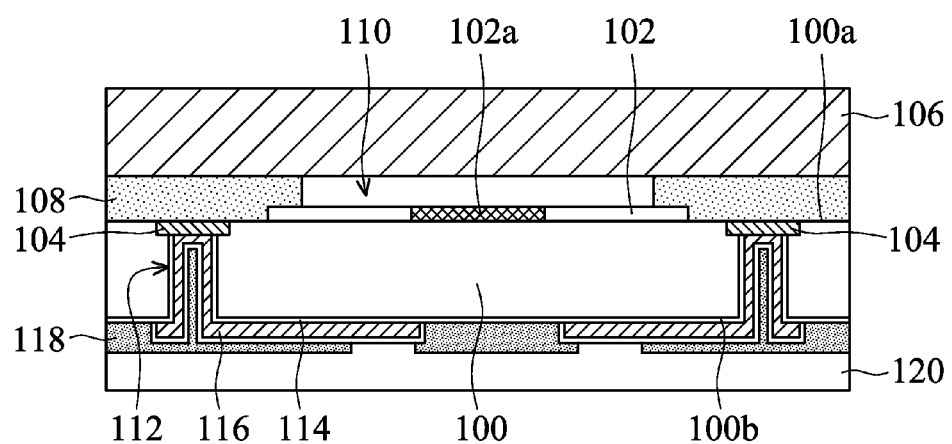

Next, the semiconductor substrate 106 is partially removed from the surface of the semiconductor substrate 106 to form a through-hole extending toward the substrate 100. As shown in FIG. 1F, in one embodiment, the substrate 100 may be fixed to a fixed layer 120, such as tape. Then, the semiconductor substrate 106 may be optionally thinned from the upper surface of the semiconductor substrate 106 by using the fixed layer 120 as support. For example, the suitable thinning processes comprise a mechanical polishing process, a chemical mechanical polishing process, an etching process, or combinations thereof.

Figure 1G:
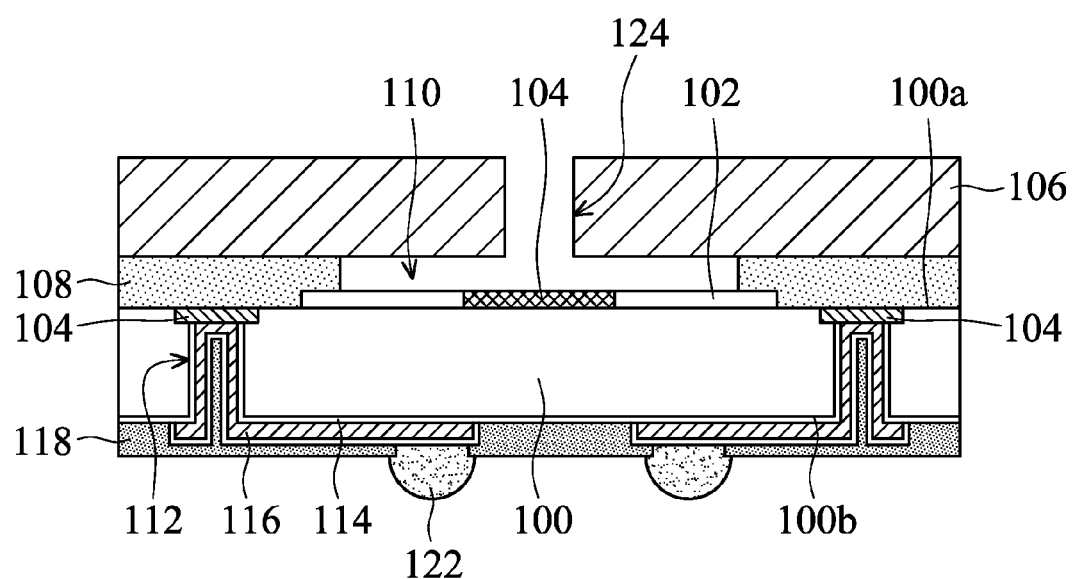

Next, as shown in FIG. 1G, the semiconductor substrate 106 is partially removed from the upper surface of the semiconductor substrate 106 to form a through-hole 124 extending toward the substrate 100. The through-hole 124 may connect to the cavity 110. In one embodiment, the through-hole 124 may be formed by using a wet etching process, a dry etching process, a laser engraved process, or combinations thereof. In one embodiment, sidewalls of the through-hole 124 may not be coplanar with the side of the spacer layer 108 that is most adjacent thereto. The through-hole 124 may optionally expose the sensing region 102a directly. In one embodiment, the caliber of the through-hole 124 may be equal to that of the sensing region 102a. In another embodiment, the caliber of the through-hole 124 may be smaller than that of the sensing region 102a. In yet another embodiment, the caliber of the through-hole 124 may be larger than that of the sensing region 102a. The opening of the through-hole 124 may comprise various shapes, such as a circle, rectangle, ellipse, fan, or polygon.

In one embodiment, a covering tape (not shown) may optionally be disposed on the surface of the semiconductor substrate 106 and cover the through-hole 124. The covering tape would facilitate the subsequent processes and protect the sensing region 102a from being contaminated or damaged. Next, the fixed layer 120 may be removed. After that, a bump process may be performed in the opening of the protective layer 118 by using the covering tape as support to form conductive bumps 122. For example, the material of the conductive bumps 122 may be, but are not limited to, tin, lead, copper, gold, nickel, or combinations thereof. Then, the covering tape may be optionally removed.

Next, a dicing process may be optionally performed along predetermined scribe lines (not shown) on the substrate 100 to form a plurality of chip packages separated from each other. In one embodiment, the sensing region 102a may comprise a light sensitive region (not shown). The light sensitive region is preferably not illuminated by light to ensure successful operation of the sensing region 102a. In one embodiment, the light sensitive region of the sensing region 102a is covered by the semiconductor substrate 106 and substantially not illuminated by light. In one embodiment, the light sensitive region of the sensing region 102a may be further covered by the spacer layer 108.

FIGS. 2A-2F are cross-sectional views of an exemplary embodiment of a method for forming a chip package according to the invention, wherein the same or similar reference numbers are used to designate the same or similar elements. In addition, the same or similar elements may be formed by the same or similar materials and/or processes.

Figure 2A:
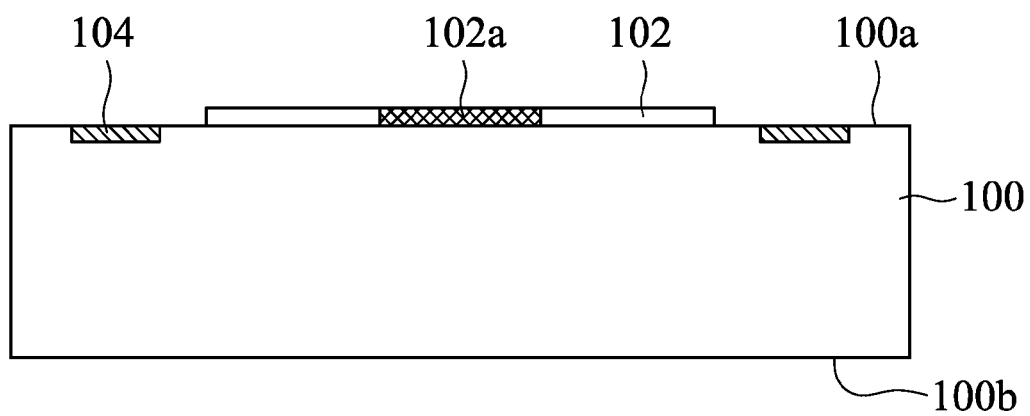
FIGS. 2A-2F are cross-sectional views of an exemplary embodiment of a method for forming a chip package according to the invention.
Figure 2B:
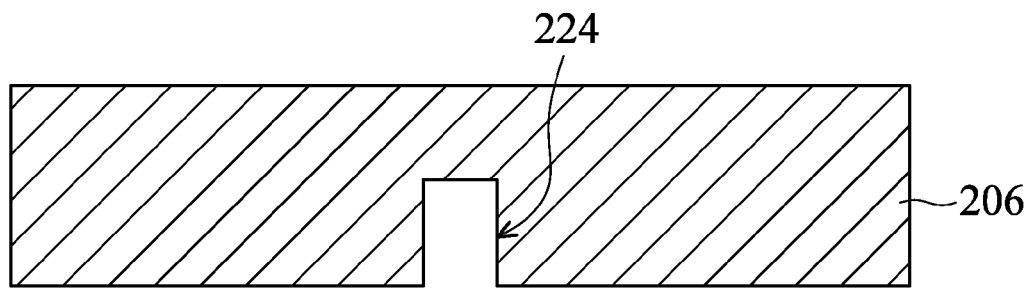

As shown in FIG. 2A, a substrate 100 and a sensing layer 102 are provided, which may have a structure similar to that in FIG. 1A. Next, a semiconductor substrate 106 is provided. In one embodiment, the semiconductor substrate 106 is a semiconductor wafer, such as a silicon wafer. The semiconductor substrate 106 may have a size and shape similar to that of the substrate 100. Next, the semiconductor substrate 106 is partially removed from the lower surface of the semiconductor substrate 106 to form at least one opening 224 extending toward the upper surface of the substrate 100. In one embodiment, the opening 224 does not penetrate the semiconductor substrate 106.

Figure 2C:
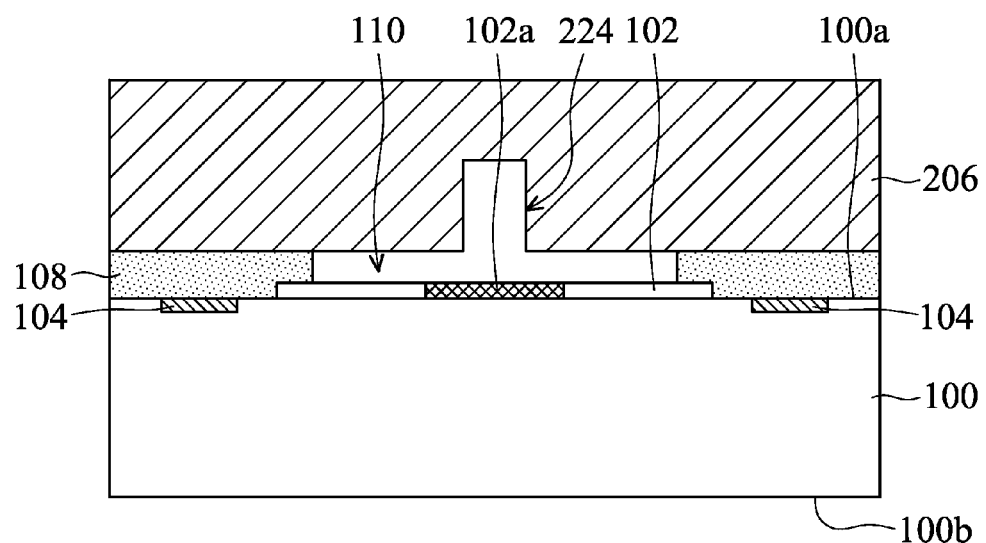

Next, as shown in FIG. 2C, the semiconductor substrate 106 may be disposed on the substrate 100, and a spacer layer 108 is disposed between the semiconductor substrate 106 and the substrate 100. Similarly, the spacer layer 108 may have been previously formed on the lower surface of the semiconductor substrate 106, or it may have been previously formed on the surface 100a of the substrate 100. In one embodiment, the opening 224 in the semiconductor substrate 106 may be aligned to the sensing region 102a. The opening 224 may connect the surrounding cavity 110.

Figure 2D:
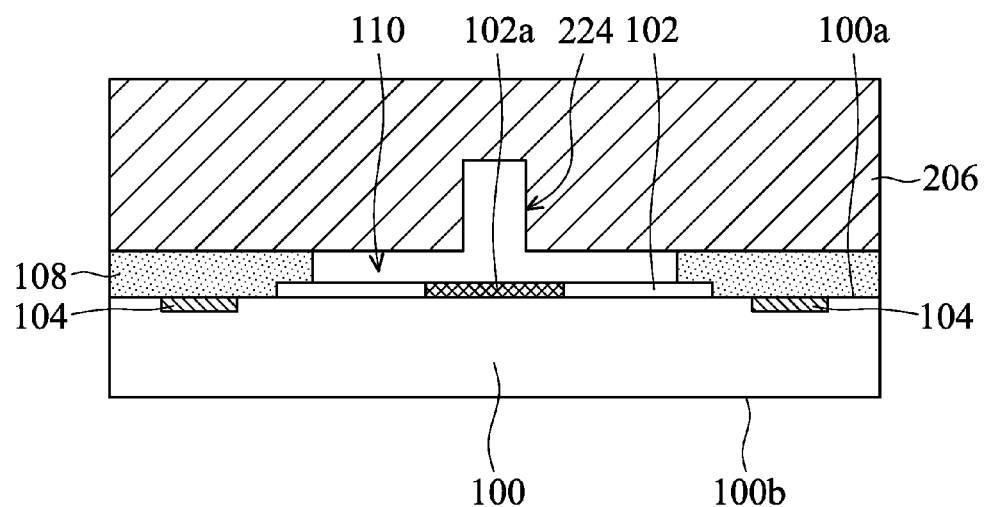
Figure 2E:
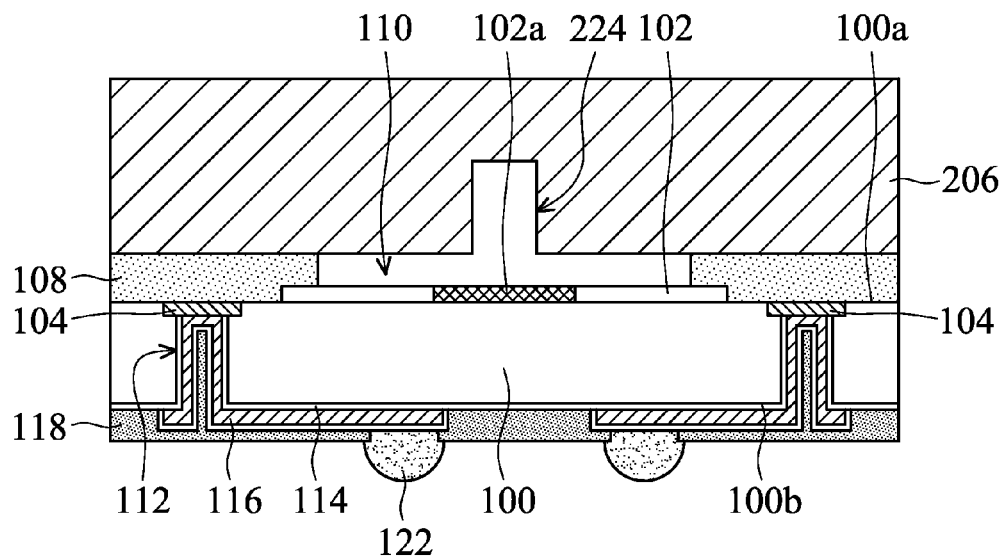

Next, as shown in FIGS. 2D-2E, various processes may be performed on the surface 100b of the substrate 100 by using the upper surface of the semiconductor substrate 106 as support. For example, as shown in FIG. 2D, the substrate 100 may be thinned from the surface 100b. Next, as shown in FIG. 2E, holes 112, an insulating layer 114, a wire layer 116 and a protective layer 118 may be formed by the similar methods in FIGS. 1D-1E. Then, conductive bumps 122 may be formed in the openings of the protective layer 118 which expose the wire layer 116.

Figure 2F:
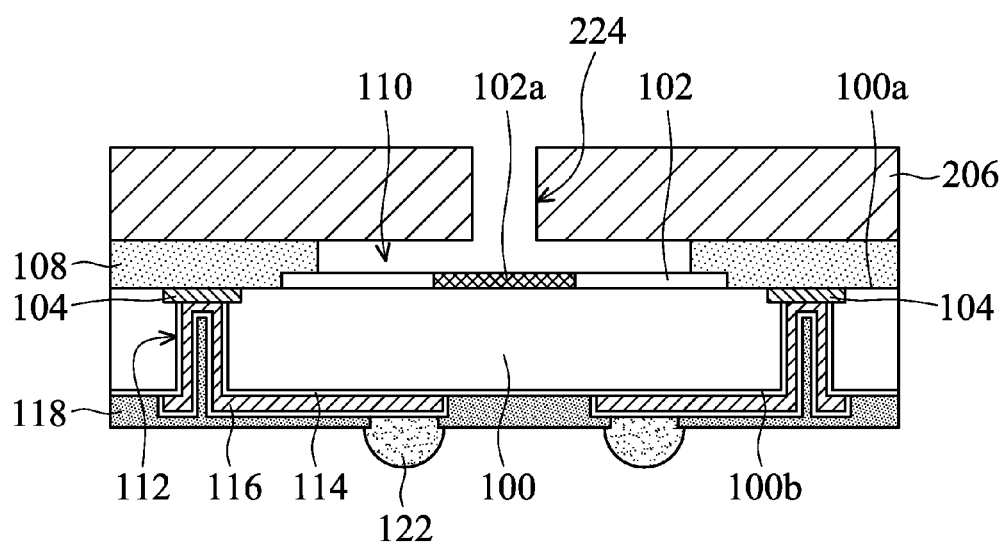

Next, as shown in FIG. 2F, the semiconductor substrate 106 is thinned from the upper surface of the semiconductor substrate 106 to expose the opening 224. After the thinning process, the opening 224 may become a through-hole penetrating the semiconductor substrate 106. Therefore, reference number 224 also refers to a through-hole 224. Similarly, a dicing process may be optionally performed along predetermined scribe lines (not shown) on the substrate 100 to form a plurality of chip packages separated from each other, which may have a similar structure to that illustrated in FIG. 1G.

Figure 3:
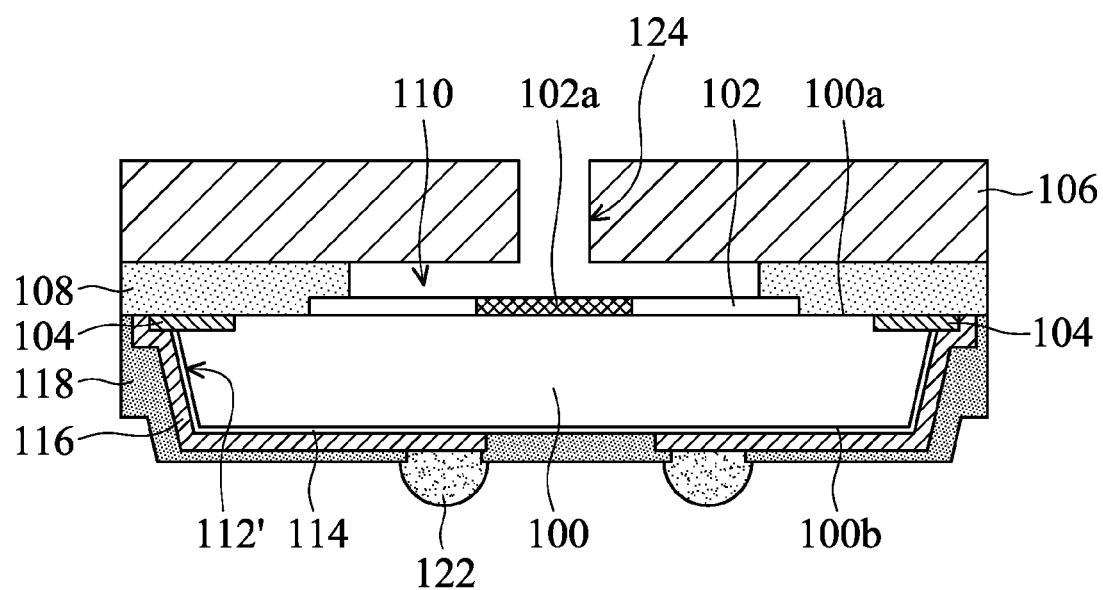
FIG. 3 is a cross-sectional view of an exemplary embodiment of a chip package according to the invention.

FIG. 3 is a cross-sectional view of an exemplary embodiment of a chip package according to the invention, wherein the same or similar reference numbers are used to designate the same or similar elements.

As shown in FIG. 3, the wire layer 116 in the embodiment of the disclosure is not limited to being electrically connected to the conducting pad structures 104 by the holes penetrating the substrate 100. In one embodiment, the wire layer 116 may extend along the side surfaces of the substrate 100 and be electrically connected to the exposed conducting pad structures 104. There may be a T-contact, an L-contact, or an S-contact between the wire layer 116 and the conducting pad structures 104.

According to the processes described in the embodiments, the size of the chip packages would be significantly reduced, and numerous chip packages could be fabricated, and the cost and time for processing would be reduced.

While the invention has been described by way of example and in terms of preferred embodiment, it is to be understood that the invention is not limited thereto. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A chip package, comprising:
   a substrate having a first surface and a second surface;
   a sensing layer disposed on the first surface of the substrate, wherein the sensing layer has a sensing region;
   a conducting pad structure disposed on the substrate and electrically connected to the sensing region;
   a spacer layer disposed on the first surface of the substrate;
   a semiconductor substrate placed on the spacer layer, wherein the semiconductor substrate, the spacer layer, and the substrate together surround a cavity on the sensing region; and
   a through-hole extending from a surface of the semiconductor substrate toward the substrate, wherein the through-hole connects to the cavity.

2. The chip package of claim 1, wherein the sensing region comprises a temperature-sensing element, a humidity-sensing element, a pressure-sensing element or combinations thereof.

3. The chip package of claim 1, further comprising:
   a hole extending from the second surface of the substrate toward the conducting pad structure;
   a wire layer disposed on the second surface of the substrate and extending into the hole to electrically connect the conducting pad structure; and
   an insulating layer disposed between the wire layer and the substrate.

4. The chip package of claim 3, further comprising:
   a protective layer disposed on the second surface of the substrate and having an opening exposing the wire layer; and
   a conductive bump disposed in the opening and electrically connected to the wire layer.

5. The chip package of claim 1, wherein the through-hole directly exposes the sensing region.

6. The chip package of claim 1, wherein the spacer layer is in direct contact with the semiconductor substrate.

7. The chip package of claim 1, wherein a side of the spacer layer that is most adjacent to the through-hole is not coplanar with a sidewall of the through-hole.

8. The chip package of claim 1, wherein the spacer layer does not contact any adhesive glue.

9. The chip package of claim 1, further comprising:
   a wire layer disposed on the second surface of the substrate, extending along a side surface of the substrate, and electrically connected to the conducting pad structure; and
   an insulating layer disposed between the wire layer and the substrate.

10. A method for forming a chip package, comprising:
    providing a substrate having a first surface and a second surface, wherein a sensing layer having a sensing region is disposed on the first surface of the substrate, and a conducting pad structure is disposed on the substrate and electrically connected to the sensing region;
    providing a semiconductor substrate;
    placing the semiconductor substrate on the substrate and placing a spacer layer between the substrate and the semiconductor substrate, wherein the semiconductor substrate, the spacer layer, and the substrate together surround a cavity on the sensing region; and
    forming a through-hole extending toward the substrate, wherein the through-hole is connected to the cavity.

11. The method of claim 10, further comprising:
    partially removing the substrate from the second surface of the substrate to form a hole substrate extending toward the conducting pad structure;
    forming an insulating layer on the second surface of the substrate and sidewalls of the hole; and
    forming a wire layer on the insulating layer and extending into the hole to electrically connect the conducting pad structure.

12. The method of claim 11, further comprising thinning the substrate from the second surface of the substrate prior to formation of the hole.

13. The method of claim 11, further comprising:
    forming a protective layer on the second surface of the substrate, wherein the protective layer has an opening exposing the wire layer; and
    forming a conductive bump in the opening, wherein the conductive bump is electrically connected to the wire layer.

14. The method of claim 10, wherein the step of forming the through-hole comprises after placing the semiconductor substrate on the substrate, partially removing the semiconductor substrate from a surface of the semiconductor substrate to form the through-hole extending toward the substrate.

15. The method of claim 14, further comprising thinning the semiconductor substrate prior to formation of the through-hole.

16. The method of claim 10, wherein the step of forming the through-hole comprises:
    before placing the semiconductor substrate on the substrate, partially removing the semiconductor substrate from a lower surface of the semiconductor substrate to form an opening extending toward an upper surface of the substrate, wherein the opening does not penetrate the semiconductor substrate; and
    after placing the semiconductor substrate on the substrate, thinning the semiconductor substrate from the upper surface of the semiconductor substrate to expose the opening and form the through-hole.

17. The method of claim 10, wherein the step of placing the spacer layer between the substrate and the semiconductor substrate comprises:
    forming the spacer layer on the semiconductor substrate; and
    placing the semiconductor substrate and the spacer layer on the first surface of the substrate.

18. The method of claim 10, wherein the step of placing the spacer layer between the substrate and the semiconductor substrate comprises:
    forming the spacer layer on the first surface of the substrate; and
    placing the semiconductor substrate on the spacer layer on the first surface of the substrate.

19. The method of claim 10, wherein the through-hole directly exposes the sensing region.

20. The method of claim 10, further comprising performing a dicing process on the substrate to form a plurality of chip packages separated from each other.

* * * * *